(12) United States Patent
Iwama

(10) Patent No.: US 10,447,403 B2
(45) Date of Patent: Oct. 15, 2019

(54) OPTICAL MODULE AND OPTICAL TRANSCEIVER

(71) Applicant: FUJITSU LIMITED, Kawasaki-shi, Kanagawa (JP)

(72) Inventor: Masahiro Iwama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/961,976

(22) Filed: Apr. 25, 2018

(65) Prior Publication Data

US 2018/0316437 A1    Nov. 1, 2018

(30) Foreign Application Priority Data

May 1, 2017    (JP) .................. 2017-091176

(51) Int. Cl.
| | |
|---|---|
| H04B 10/00 | (2013.01) |
| H04B 10/40 | (2013.01) |
| H01L 31/167 | (2006.01) |
| H01S 5/183 | (2006.01) |
| G02B 5/30 | (2006.01) |
| H04B 10/2543 | (2013.01) |
| H04J 14/00 | (2006.01) |

(52) U.S. Cl.
CPC .......... *H04B 10/40* (2013.01); *G02B 5/3025* (2013.01); *H01L 31/167* (2013.01); *H01S 5/183* (2013.01); *H04B 10/2543* (2013.01)

(58) Field of Classification Search
CPC ...... H04B 10/801; H04B 10/803; H04J 14/06
See application file for complete search history.

(56) References Cited

U.S. PATENT DOCUMENTS

| | | | | |
|---|---|---|---|---|
| 2013/0195456 A1* | 8/2013 | Sorin | ............... | H04B 10/504 398/65 |
| 2014/0185139 A1* | 7/2014 | Miao | ............... | G02B 5/3083 359/489.08 |

FOREIGN PATENT DOCUMENTS

| | | |
|---|---|---|
| JP | 11-289317 | 10/1999 |
| JP | 2005-242331 | 9/2005 |

* cited by examiner

*Primary Examiner* — Daniel G Dobson
(74) *Attorney, Agent, or Firm* — Fujitsu Patent Center

(57) ABSTRACT

An optical module includes a light emitter array in which a plurality of light emitters are arranged, and a lens group which converges light beams output from the light emitter array, wherein in a stage where the light beams reach the lens group, planes of polarization of the light beams are different between adjacent light emitters.

9 Claims, 8 Drawing Sheets

OPTICAL MODULE AND OPTICAL TRANSCEIVER

CROSS-REFERENCE TO RELATED APPLICATION

This application is based upon and claims the benefit of priority of the prior Japanese Patent Application No. 2017-91176, filed on May 1, 2017, the entire contents of which are incorporated herein by reference.

FIELD

The embodiments discussed herein are related to an optical module and an optical transceiver.

BACKGROUND

In recent years, multilane and densification in optical transmission are progressed along with an increase in communication capacity between devices. Multilane and densification in optical transmission may be realized by narrowing an interval between channels, for example.

However, when the interval between channels is narrowed, crosstalk easily occurs. For example, when an optical axis deviation occurs between a vertical cavity surface emitting laser (VCSEL) array which is included in a transmission module and a lens block, light beams output from the VCSEL are not only input to a predetermined lens (regular lens), but also are leaked to a portion between the regular lens and a lens adjacent thereto (adjacent lens), or are input to the adjacent lens. The light beams which are input to the regular lens are guided to a predetermined optical fiber (regular optical fiber); however, there is a case in which the light beams leaked to a portion between the regular lens and the adjacent lens, and the light beams input to the adjacent lens are guided to an optical fiber adjacent to the regular optical fiber (adjacent optical fiber). An occurrence of crosstalk leads to a deterioration in transmission quality.

Accordingly, in order to suppress an occurrence of crosstalk, an improvement in manufacturing accuracy of a component itself which is used in optical transmission and an improvement in a positioning accuracy between components have been attempted.

However, it is desirable to use an expensive manufacturing device in order to improve the manufacturing accuracy, and it takes time for adjusting in order to improve the positioning accuracy. That is, in the related art, it is difficult to obtain a highly effective and excellent transmission quality.

The followings are reference documents.
[Document 1] Japanese Laid-open Patent Publication No. 11-289317 and
[Document 2] Japanese Laid-open Patent Publication No. 2005-242331.

SUMMARY

According to an aspect of the invention, an optical module includes a light emitter array in which a plurality of light emitters are arranged, and a lens group which converges light beams output from the light emitter array, wherein in a stage where the light beams reach the lens group, planes of polarization of the light beams are different between adjacent light emitters.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments are described in detail while referring to accompanying drawings.

First Embodiment

Figure 1:
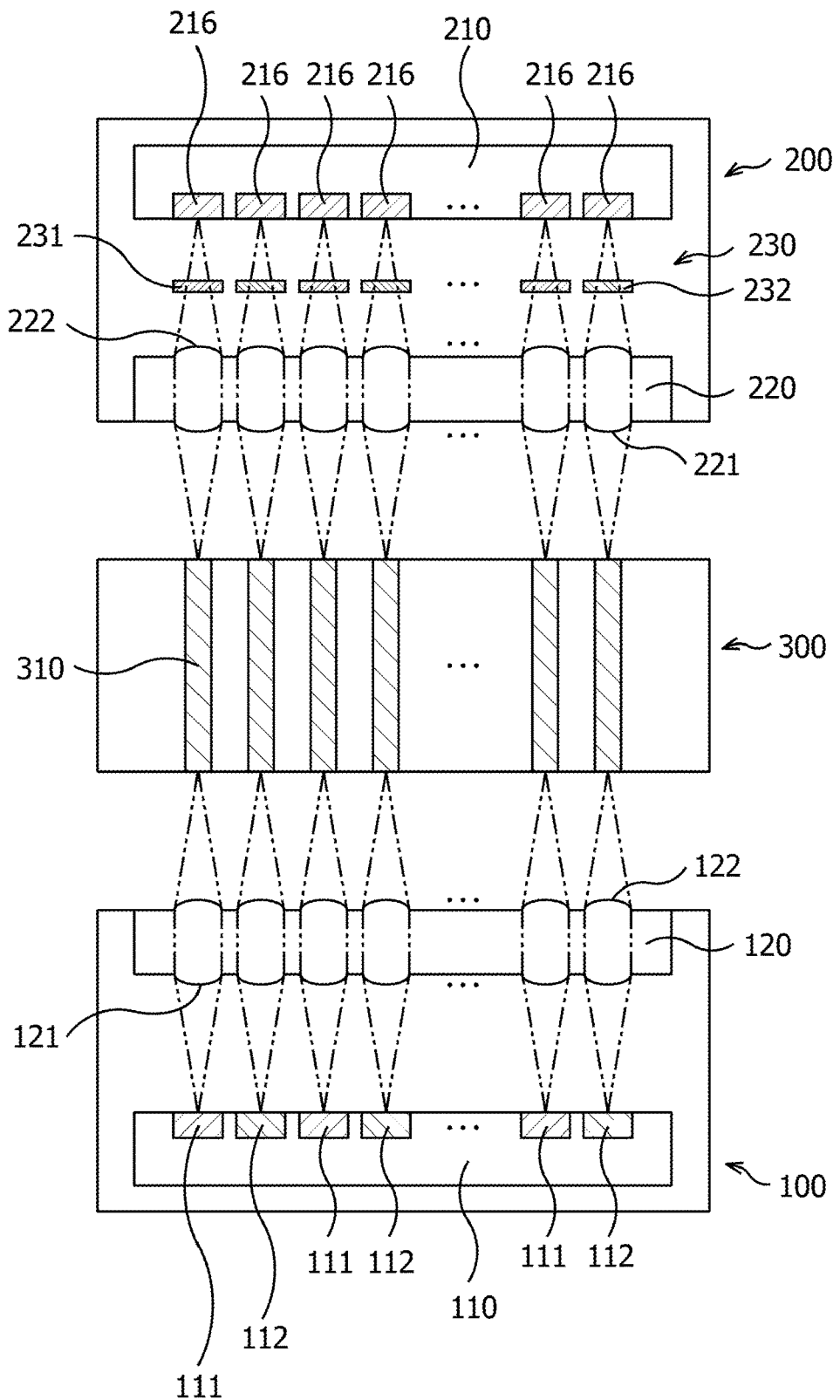
FIG. 1 is a block diagram which illustrates an optical transmission system according to a first embodiment.

First, a first embodiment is described. The first embodiment is an example of an optical transmission system. FIG. 1 is a block diagram which illustrates an optical transmission system according to the first embodiment.

The optical transmission system according to the first embodiment includes a transmission module 100 which sends an optical signal, a reception module 200 which receives the optical signal, and an optical fiber cable 300 which transmits the optical signal.

A light emitter array 110 and a lens block 120 are included in the transmission module 100. The light emitter array 110 includes a plurality of light emitters 111 and light emitters 112 which are alternately disposed in one direction. The light emitters 111 and 112 are, for example, the vertical cavity surface emitting laser (VCSEL), fabry-perot (FP) type laser, or a light emitting diode (LED). A plane of polarization of output light beams is deviated between the light emitters 111 and 112. A deviation angle of the plane of polarization is preferably 90°. The lens block 120 includes the plurality of lenses 121 which set light beams output from the light emitters 111 and 112 to collimated light, and the plurality of lenses 122 which converge the collimated light in the outside of the transmission module 100. A distance between the lens 121, the light emitter 111, and the light emitter 112 is the same as a focal distance of the lens 121. The lens block 120 is an example of first lens group.

A plurality of optical fibers 310 which transmit light beams output from the lens 122 are included in the optical fiber cable 300. A distance between an end face of the optical fiber 310 on the transmission module 100 side and the lens 122 is the same as a focal distance of the lens 122.

A photodetector array 210, a lens block 220, and a slit group 230 are included in the reception module 200. A plurality of photodetectors 216 which are disposed in one direction are included in the photodetector array 210. The photodetector 216 is, for example, a photo diode (PD). A plurality of lenses 221 which set light beams output from the optical fiber 310 to collimated light, and a plurality of lenses 222 which converge the collimated light in the photodetector 216 are included in the lens block 220. A distance between the lens 221 and an end face of the optical fiber 310 on the reception module 200 side is the same as a focal distance of the lens 221. A distance between the lens 222 and the photodetector 216 is the same as a focal distance of the lens 222. A plurality of slits 231 and 232 which are alternately disposed in one direction are included in the slit group 230. The slit 231 is disposed on a path of light beams output from the light emitter 111, causes light beams including the same plane of polarization as that of the light beams output from the light emitter 111 to pass therethrough, and blocks other light beams. The slit 232 is disposed on a path of light beams output from the light emitter 112, causes light beams including the same plane of polarization as that of light beams output from the light emitter 112 to pass therethrough, and blocks other light beams. The slits 231 and 232 are liquid crystal, for example. The lens block 220 is an example of a second lens group.

In the optical transmission system, when a manufacturing accuracy and a positioning accuracy are sufficient, the following operation is performed. Light beams output from the light emitters 111 and 112 are input to the lens 121. When the light emitters 111 and 112 are the VCSEL, light beams are widened with a radiation angle of approximately 10° to 20° due to diffraction. The light beams input to the lens 121 are set to collimated light. The collimated light is condensed at an end face of the optical fiber 310 due to the lens 122. The light beams transmitted by the optical fiber 310 are input to the lens 221, and the lens 221 sets the input light beams to collimated light. The collimated light is condensed in the photodetector 216 through the slit 231 or 232 by the lens 222.

Figure 2:
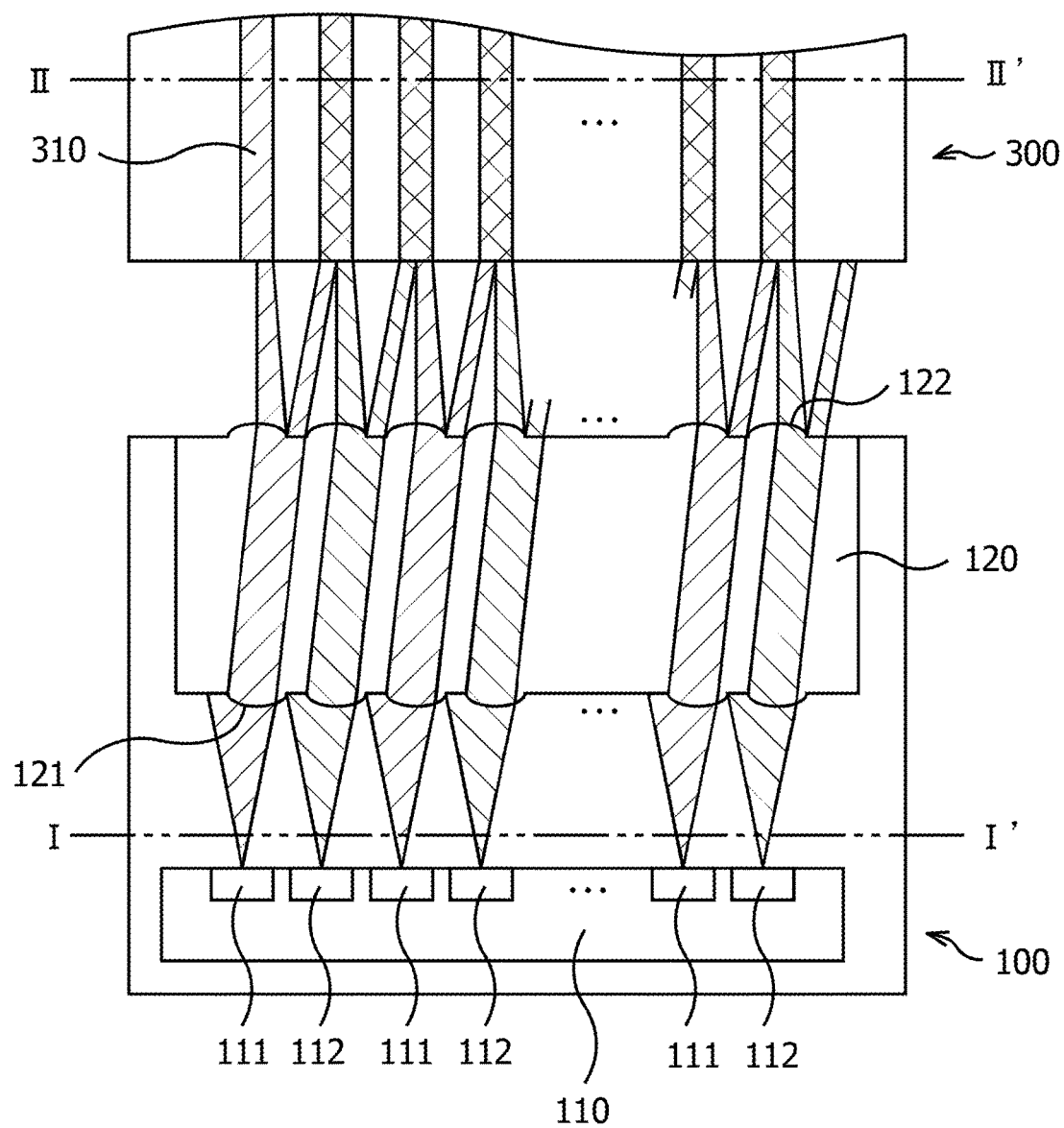
FIG. 2 is a diagram which illustrates an optical path on a transmission module side when a positioning accuracy is low in the first embodiment.
Figure 3:
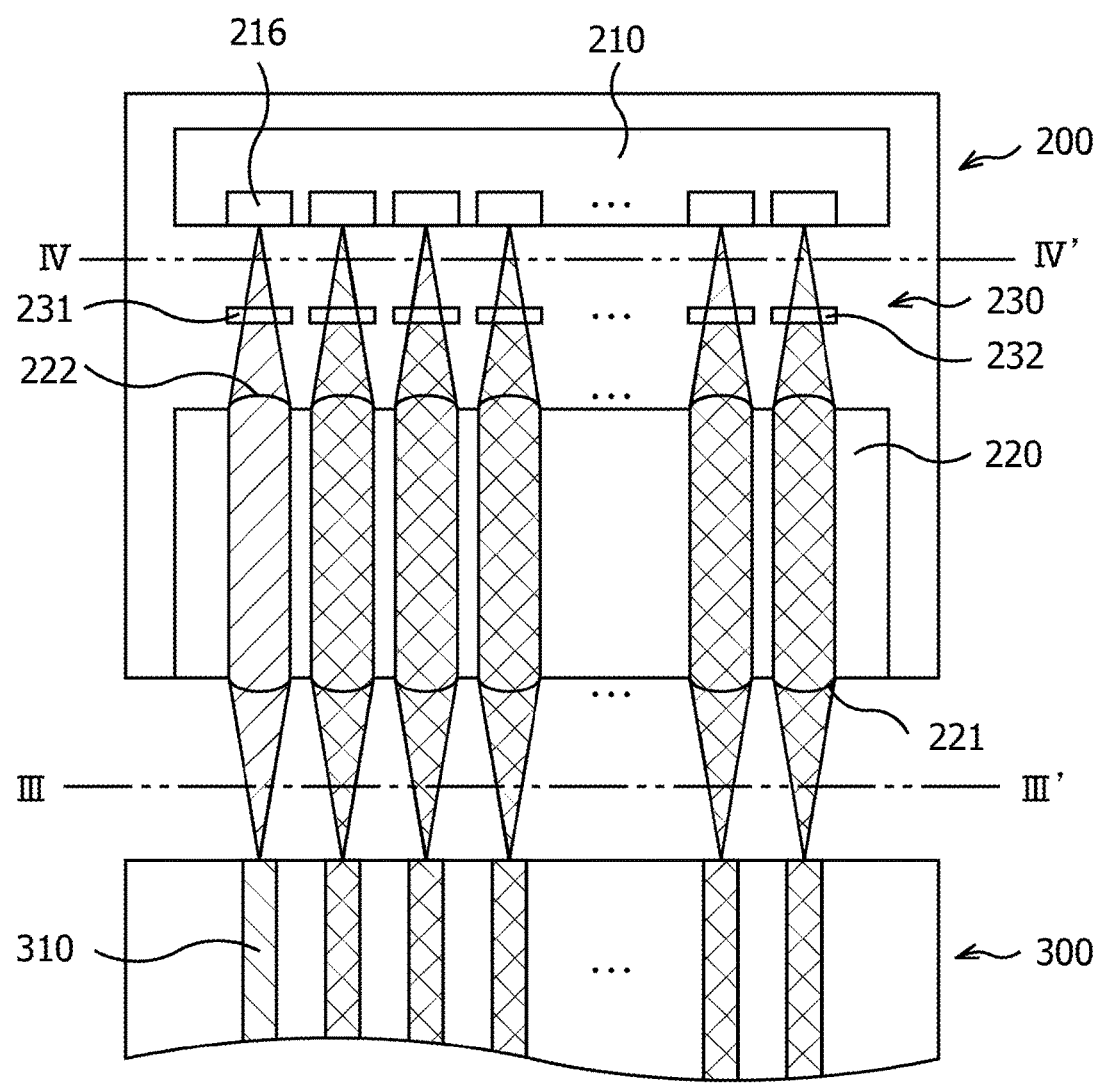
FIG. 3 is a diagram which illustrates an optical path on a reception module side when the positioning accuracy is low.

Subsequently, an example of an operation when the light emitter array 110 is deviated from the lens block 220 in an arrangement direction of the light emitters 111 and 112 is described. FIGS. 2 and 3 are diagrams which illustrate an optical path when a positioning accuracy is low, FIG. 2 illustrates an optical path on the transmission module 100 side, and FIG. 3 illustrates an optical path on the reception module 200 side. FIGS. 4A to 4D are schematic views which illustrate polarization at a position denoted by the lines I-I', II-II' in FIG. 2, and lines III-III' and IV-IV' in FIG. 3, respectively.

Figure 4A:
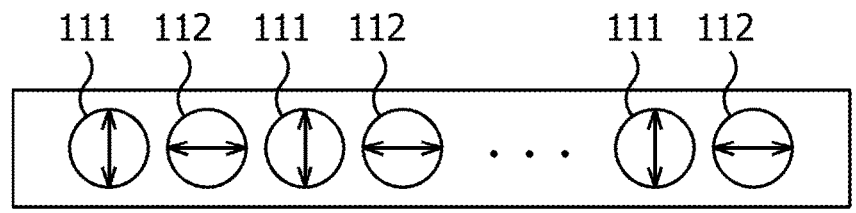
FIGS. 4A to 4D are schematic views which illustrate polarization at a specific position in FIGS. 2 and 3.
Figure 4B:
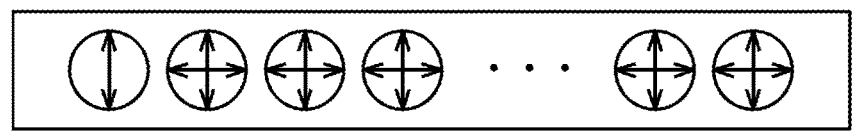
Figure 4C:
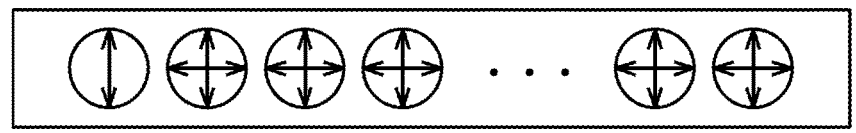

A plane of polarization of light beams which are output is orthogonal to each other between the light emitters 111 and 112 (FIG. 4A). When the light emitter array 110 is deviated from the lens block 220 in an arrangement direction of the light emitters 111 and 112, as illustrated in FIG. 2, light beams output from the light emitters 111 and 112 are input to the lens 121 by being deviated. For this reason, the collimated light from the lens 121 is not only input to a predetermined lens 122 (regular lens), but also is leaked to a portion between the regular lens and a lens 122 which is adjacent thereto (adjacent lens), or the adjacent lens. The light beams input to the regular lens are guided to a predetermined optical fiber 310 (regular optical fiber); however, the light beams leaked to the portion between the regular lens and the adjacent lens, and the light beams input to the adjacent lens are guided to an optical fiber 310 which is adjacent to the regular optical fiber (adjacent optical fiber). Light beams in which these are set to the regular optical fiber are also introduced to the adjacent optical fiber. That is, both of light beams output from the light emitters 111 and 112 are input to a part of the optical fiber 310. In a part of the optical fiber 310, two types of light beams of which planes of polarization are orthogonal to each other are transmitted (FIG. 4B).

Figure 4D:
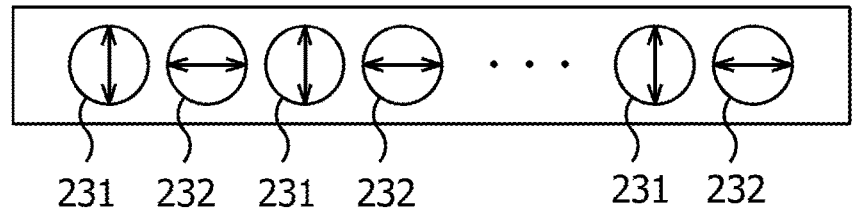

As illustrated in FIG. 3, light beams which are transmitted by the optical fiber 310 are input to the lens 221, and the lens 221 sets the input light beams to collimated light. The collimated light is condensed in the photodetector 216 through the slit 231 or the slit 232 by the lens 222. According to the embodiment, the slit 231 is disposed at a path of light beams output from the light emitter 111, causes light beams with the same plane of polarization as that of light beams output from the light emitter 111 to pass therethrough, and blocks other light beams. The slit 232 is disposed at a path of light beams output from the light emitter 112, causes light beams with the same plane of polarization as that of light beams output from the light emitter 112 to pass therethrough, and blocks other light beams. Accordingly, in a stage where the light beams reach the slit 231 or 232, two types of light beams of which a plane of polarization are orthogonal to each other are included in a part of light beams (FIG. 4C); however, a plane of polarization of light beams which pass through the slit 231 matches a plane of polarization of light beams output from the light emitter 111, and a plane of polarization of light beams which pass through the slit 232 matches a plane of polarization of light beams output from the light emitter 112 (FIG. 4D).

Accordingly, according to the first embodiment, crosstalk is removed from light beams which reach the respective photodetectors 216, even when crosstalk occurs in the middle of transmission. For this reason, it is possible to obtain an excellent transmission quality, even when the manufacturing accuracy and the positioning accuracy are relatively low.

Second Embodiment

Figure 5:
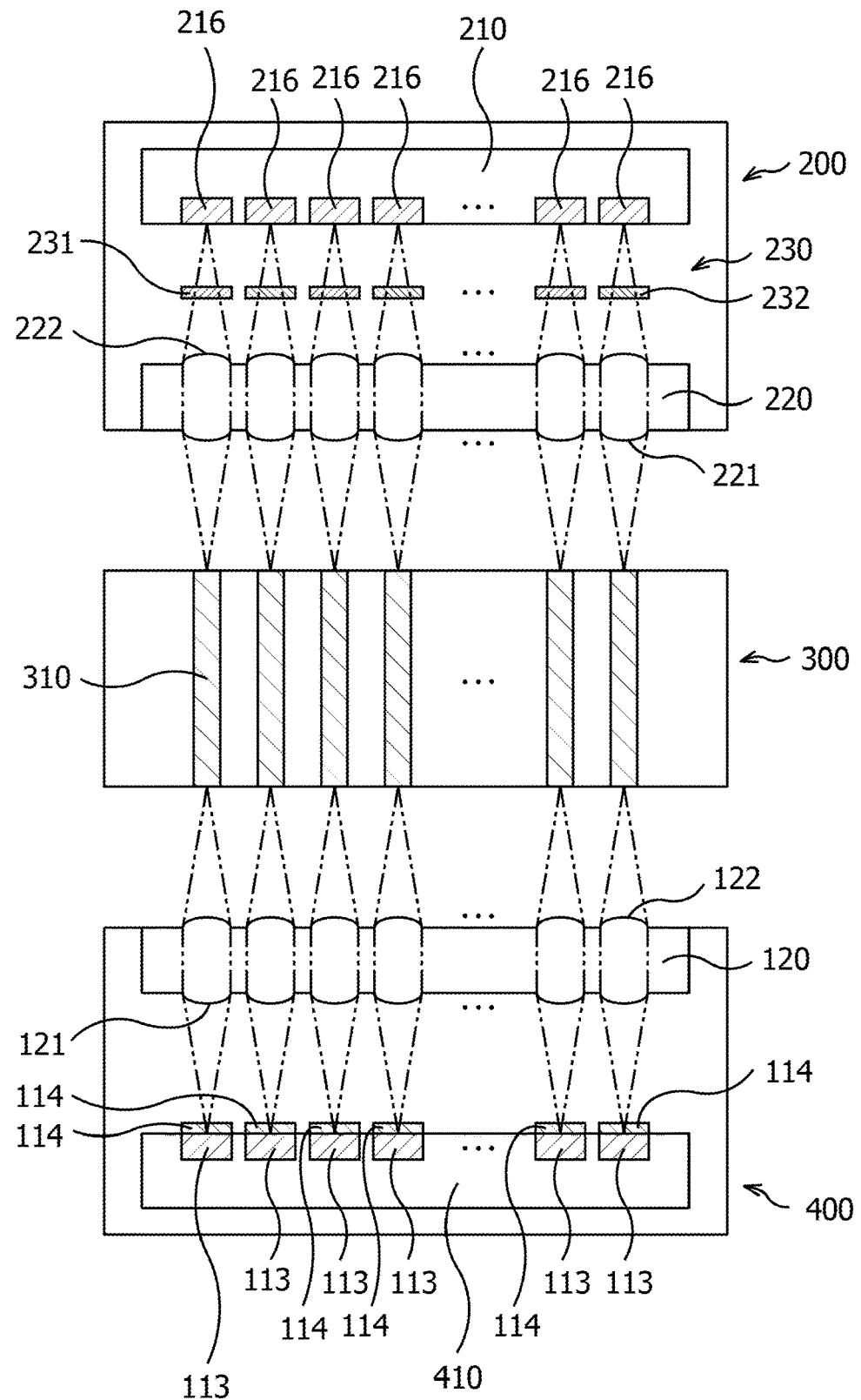
FIG. 5 is a block diagram which illustrates an optical transmission system according to a second embodiment.

Subsequently, a second embodiment is described. The second embodiment is different from the first embodiment in a configuration of the transmission module. FIG. 5 is a block diagram which illustrates an optical transmission system according to the second embodiment.

In the optical transmission system according to the second embodiment, a transmission module 400 which sends an optical signal, a reception module 200 which receives the optical signal, and an optical fiber cable 300 which transmits the optical signal are included.

A light emitter array 410 and a lens block 120 are included in the transmission module 400. A plurality of light emitters 113 which are arranged in one direction are included in the light emitter array 410. The light emitter 113 is, for example, VCSEL, FP type laser, or an LED. A Faraday rotator 114 is provided on the light emitter 113. Differently from the first embodiment, a plane of polarization of the light emitter 113 is irregular. The Faraday rotator 114 causes a plane of polarization of light beams output from the light emitter 113 to rotate so as to be different from that of a light emitter 113 which is adjacent thereto. An angle of deviation of a plane of polarization is preferably 90°. In the lens block 120, a plurality of lenses 121 which set light beams output from the light emitter 113, and pass through the Faraday rotator 114 to collimated light, and a plurality of lenses 122 which converge the collimated light in the outside of the transmission module 100 are included. A distance between the lens 121 and the light emitter 113 is the same as a focal distance of the lens 121. Configurations of the reception module 200 and the optical fiber cable 300 which transmits an optical signal are the same as those in the first embodiment.

In the optical transmission system, when a manufacturing accuracy and a positioning accuracy are sufficient, the same operation as that in the first embodiment is performed.

Figure 6:
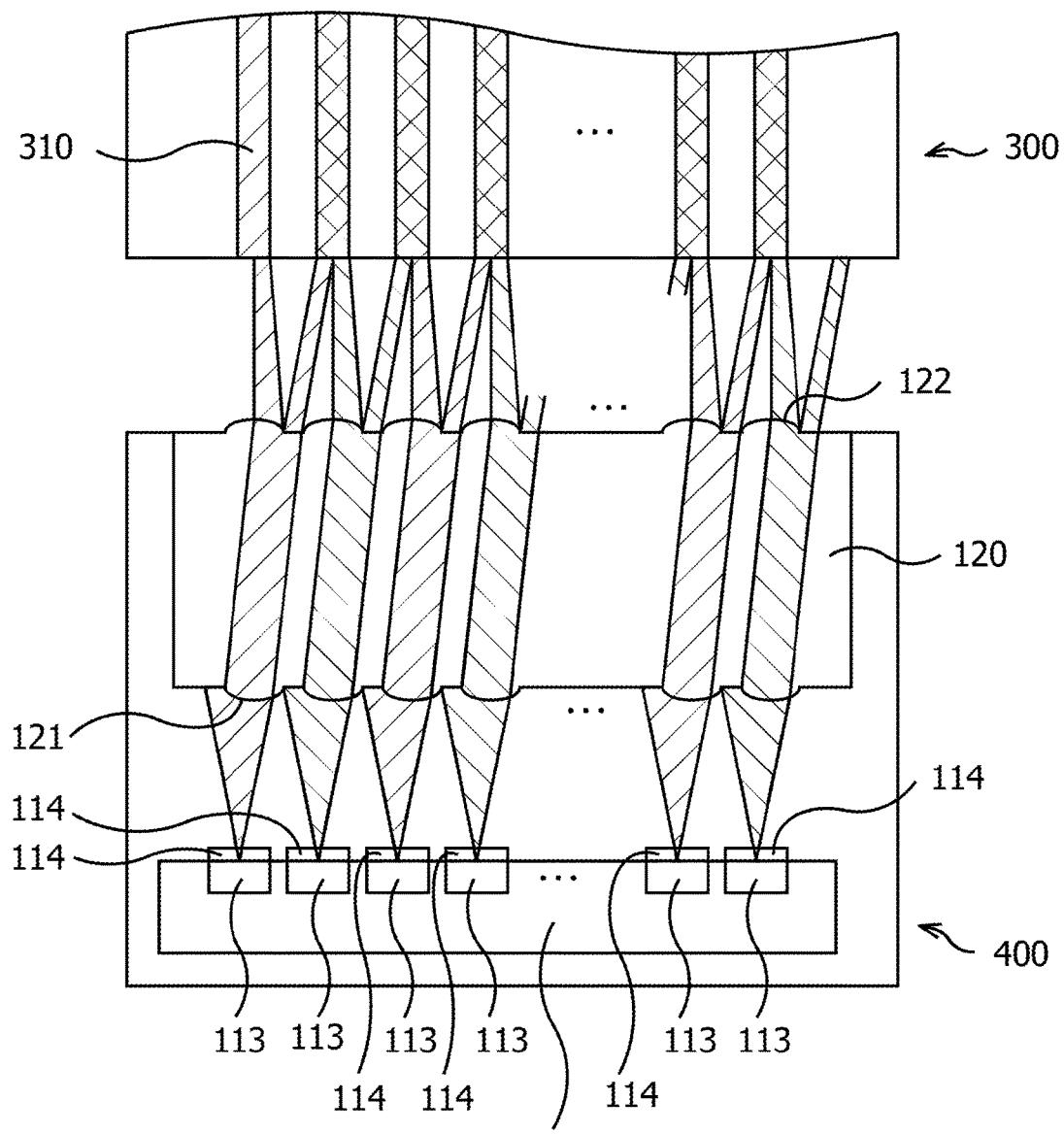
FIG. 6 is a diagram which illustrates an optical path on a transmission module side when a positioning accuracy is low in the second embodiment.

Subsequently, an example of an operation when the light emitter array 410 is deviated from the lens block 220 in an arrangement direction of the light emitter 113 is described. FIG. 6 is a diagram which illustrates a path of light beams on the transmission module 400 side when a positioning accuracy is low.

A plane of polarization of light beams output is irregular between the plurality of light emitters 113. However, according to the embodiment, the Faraday rotator 114 controls a plane of polarization of each light emitter 113, and planes of polarization of light beams which pass through the Faraday rotator 114 are orthogonal to each other between light emitters 113 which are adjacent to each other. Accordingly, when the light emitter array 410 is deviated from the lens block 220 in the arrangement direction of the light emitter 113, as illustrated in FIG. 5, a plane of polarization of light beams input to the lens 121 is the same as that in the first embodiment, and two type of light beams of which planes of polarization are orthogonal to each other are transmitted in a part of the optical fiber 310. In addition, light beams transmitted by the optical fiber 310 are subjected to the same processing as that in the first embodiment by the reception module 200.

Accordingly, also in the second embodiment, crosstalk is removed from light beams which reach each of the photodetectors 216, even when the crosstalk occurs in the middle of transmission. For this reason, it is possible to obtain an excellent transmission quality, even when a manufacturing accuracy and a positioning accuracy are relative low.

In addition, in the first embodiment, plane of polarizations of the light emitters 111 and 112 are regular; however, in the second embodiment, the plane of polarization of the light emitter 113 may be irregular. Accordingly, it is possible to easily manufacture the light emitter array 410 compared to the light emitter array 110.

Figure 7:
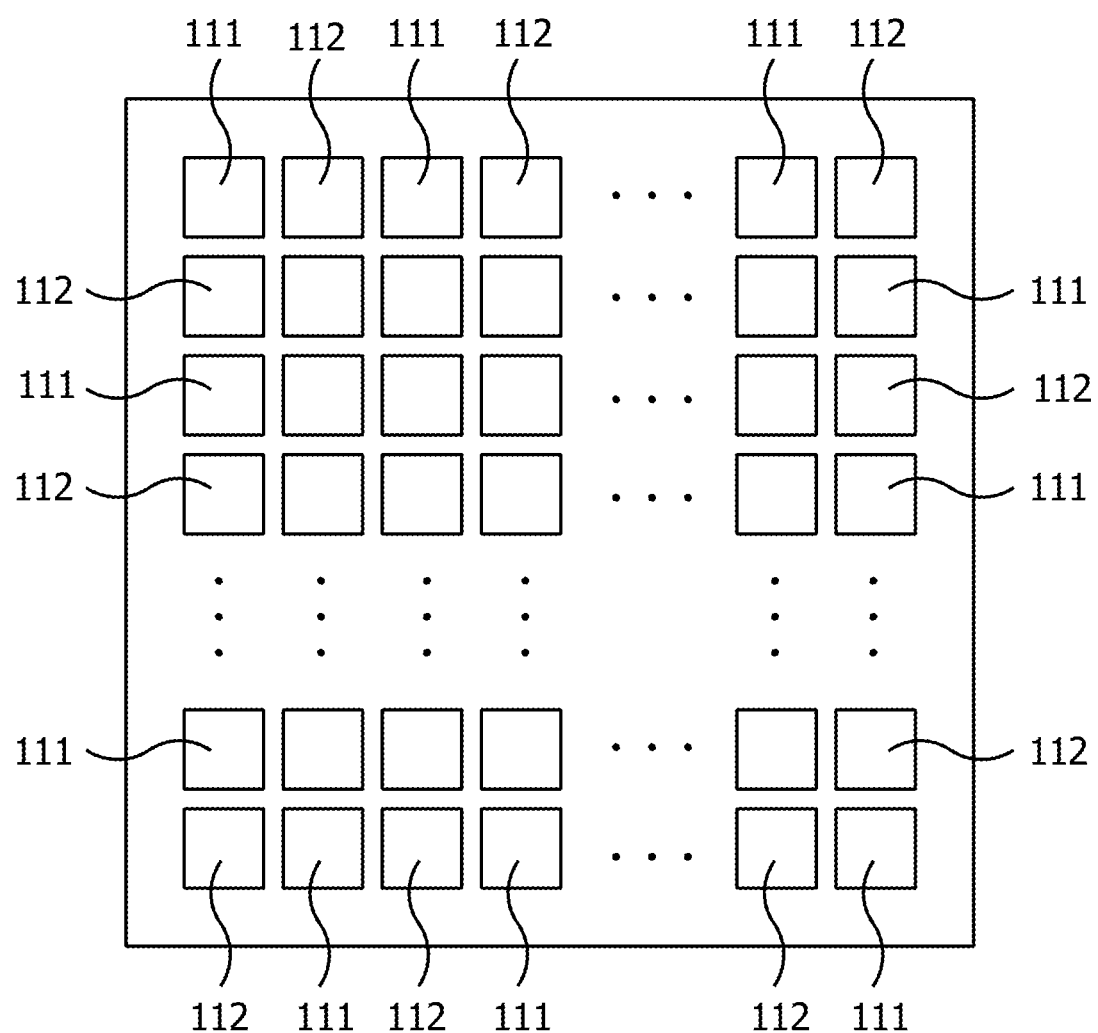
FIG. 7 is a diagram which illustrates a modification example of the first embodiment.

In the first embodiment and the second embodiment, the light emitters are arranged in one direction; however, the light emitters may be arranged lengthwise and breadthwise in two directions, in both of the embodiments. FIG. 7 is a diagram which illustrates a modification example of the first embodiment. In the modification example, the light emitters 111 and 112 are alternately arranged lengthwise and breadthwise in two directions.

In the first embodiment, a plane of polarization is deviated by 90° between the light emitters 111 and 112; however, the angle of deviation may not be 90°. Similarly, in the second embodiment, an angle of deviation of a plane of polarization of light beams which pass through the Faraday rotator 114 may not be 90°, and a wave length of light beams may be different between paths of light beams which are adjacent to each other, not only in the plane of polarization. Due to a difference in wave length, it is possible to more reliably reduce crosstalk.

Third Embodiment

Figure 8:
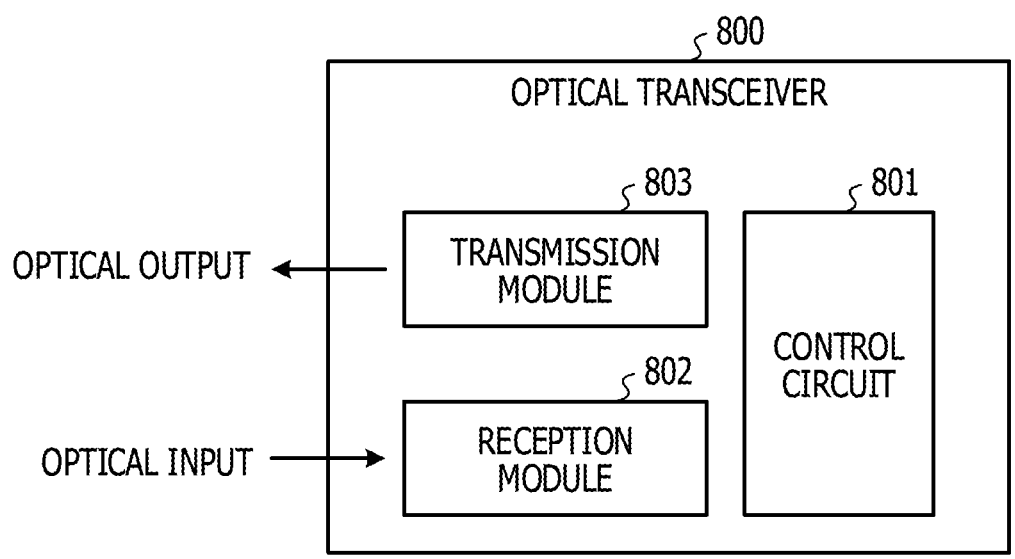
FIG. 8 is a block diagram which illustrates an optical transceiver according to a third embodiment.

Subsequently, a third embodiment is described. The third embodiment is an example of an optical transceiver. FIG. 8 is a block diagram which illustrates an optical transceiver according to the third embodiment.

As illustrated in FIG. 8, a control circuit 801, a reception module 802, and a transmission module 803 are included in an optical transceiver 800 according to the third embodiment. For example, the reception module 200 is used in the reception module 802, and the transmission module 100 or 400 is used in the transmission module 803. The reception module 802 and the transmission module 803 are controlled by the control circuit 801.

Two optical transceivers 800 are used in the optical transmission system, one transmission module 803 is connected to the other reception module 802 through the optical fiber cable 300, and the other transmission module 803 is connected to the one reception module 802. In this manner, a two-way optical transmission is executed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
    a photodetector array in which a plurality of photodetectors are arranged;
    a lens group which converges light beams in the photodetector; and
    a slit group which is installed between the photodetector array and the lens group, and causes the light beams each including an individual plane of polarization for each of the photodetectors,
    wherein the planes of polarization of the light beams which are caused to pass through the slit group are different between adjacent photodetectors.

2. The optical module according to claim 1, wherein the planes of polarization of the light beams which are caused to pass through the slit group are deviated by 90° between the adjacent photodetectors.

3. The optical module according to claim 1, wherein the photodetector is a photo diode.

4. An optical transceiver comprising:
    a transmission assembly; and
    a reception assembly,
    wherein the transmission assembly includes
    a light emitter array in which a plurality of light emitters are arranged, and
    a first lens group which converges light beams output from the light emitter array,
    wherein in a stage where the light beams reach the first lens group, planes of polarization of the light beams are different between adjacent light emitters,
    wherein the reception assembly includes
    a photodetector array in which a plurality of photodetectors are arranged,
    a second lens group which converges the light beams in the photodetector, and
    a slit group which is installed between the photodetector array and the second lens group, and causes the light beams each including an individual plane of polarization for each photodetector to pass therethrough, and wherein the planes of polarization of the light beams which are caused to pass through the slit group are different between adjacent photodetectors.

5. The optical transceiver according to claim 4,
wherein in a stage where the light beams reach the lens group, the planes of polarization of the light beams are deviated by 90° between the adjacent light emitters, and
wherein the planes of polarization of the light beams which are caused to pass through the slit group are deviated by 90° between the adjacent photodetectors.

6. The optical transceiver according to claim 4, wherein the plurality of light emitters are arranged so that the planes of polarization of the light beams which are output, are different between the adjacent light emitters.

7. The optical transceiver according to claim 4, further comprising:
a Faraday rotator which causes the planes of polarization of the light beams output from the light emitter to rotate so as to be different between the adjacent light emitters.

8. The optical transceiver according to claim 4, wherein the light emitter is a vertical cavity surface emitting laser.

9. The optical transceiver according to claim 4, wherein the photodetector is a photo diode.

* * * * *